(12) United States Patent
Choi

(10) Patent No.: US 7,772,899 B2
(45) Date of Patent: Aug. 10, 2010

(54) DELAY LOCKED LOOP AND OPERATING METHOD THEREOF

(75) Inventor: Hoon Choi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 110 days.

(21) Appl. No.: 11/967,591

(22) Filed: Dec. 31, 2007

(65) Prior Publication Data

US 2009/0115471 A1 May 7, 2009

(30) Foreign Application Priority Data

Nov. 2, 2007 (KR) .................... 10-2007-0111457

(51) Int. Cl.
*H03L 7/06* (2006.01)
(52) U.S. Cl. ..................... 327/158; 327/153
(58) Field of Classification Search ............ None
See application file for complete search history.

(56) References Cited

U.S. PATENT DOCUMENTS

| 6,956,418 | B2 * | 10/2005 | Kwak et al. ............. 327/158 |
| 7,142,026 | B2 * | 11/2006 | Kwak ..................... 327/158 |
| 7,282,974 | B2 * | 10/2007 | Lee ....................... 327/158 |
| 7,358,784 | B2 * | 4/2008 | Kim et al. ............... 327/158 |
| 7,428,286 | B2 * | 9/2008 | Kim ....................... 375/371 |
| 2003/0219088 | A1 * | 11/2003 | Kwak ................... 375/376 |
| 2005/0093600 | A1 * | 5/2005 | Kwak ................... 327/161 |
| 2005/0238128 | A1 * | 10/2005 | Kim ..................... 375/376 |
| 2008/0012615 | A1 * | 1/2008 | Park .................... 327/158 |

FOREIGN PATENT DOCUMENTS

| KR | 1020050040565 A | 5/2005 |
| KR | 1020050041196 A | 5/2005 |
| KR | 1020050048838 A | 5/2005 |
| KR | 1020060095260 A | 8/2006 |

* cited by examiner

*Primary Examiner*—Lincoln Donovan
*Assistant Examiner*—Thomas J Hiltunen
(74) *Attorney, Agent, or Firm*—IP & T Law Firm PLC

(57) ABSTRACT

A delay locked loop (DLL) includes a delay-locking unit configured to generate first and second delay clocks corresponding to first and second clock edges of a reference clock for achieving a delay-locking; a phase detection unit configured to detect a phase difference between the first and second delay clocks to output a weight selection signal; a weight storage unit configured to store the weight selection signal obtained during a predetermined period from a point of time when the first and second delay clocks are delay locked; and a phase mixing unit configured to mix phases of the first and second delay clocks to output a DLL clock by applying a weight corresponding to the stored weight selection signal in the weight storage unit.

17 Claims, 7 Drawing Sheets

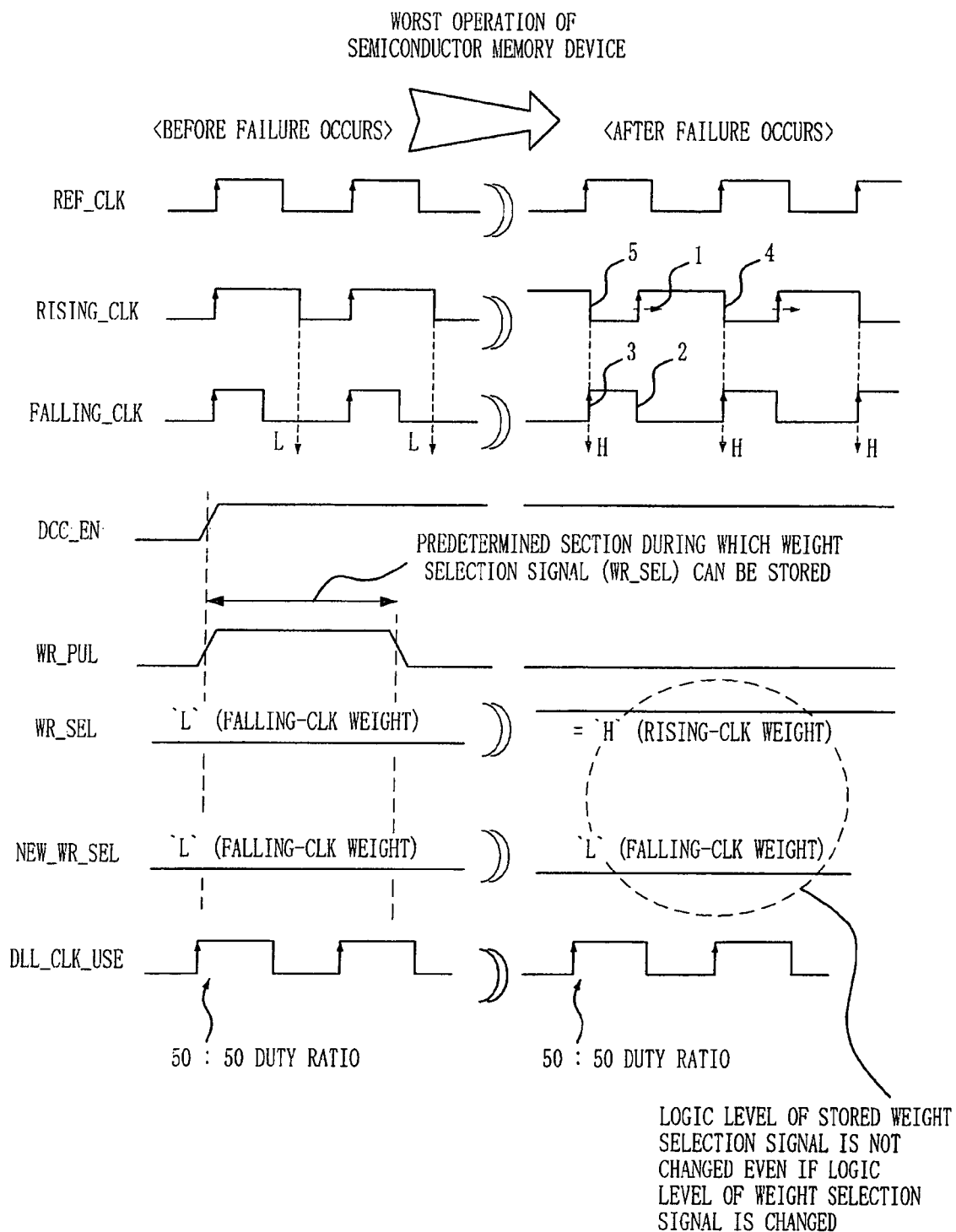

DELAY LOCKED LOOP AND OPERATING METHOD THEREOF

CROSS-REFERENCE TO RELATED APPLICATIONS

The present invention claims priority of Korean patent application number 10-2007-0111457, filed on Nov. 2, 2007, which is incorporated by reference in its entirety.

BACKGROUND OF THE INVENTION

The present invention relates to semiconductor design technology, particularly to operation of a delay locked loop (DLL), and more particularly to a DLL, which can stably operate even under the worst operating condition of a semiconductor memory device such as noise interference, process/voltage/temperature (PVT) variation and frequent entry/exit of a power down mode.

Generally, in a synchronous semiconductor memory device such as a double data rate (DDR) synchronous DRAM (SDRAM), input/output data must be always synchronized with a reference clock.

The reference clock is an external clock (CLK and CLKB) inputted from an external device, for example, a memory controller. Therefore, the meaning the synchronous semiconductor memory device must transmit data in synchronization with the reference clock is that an output point of time of the data transmitted from the synchronous semiconductor memory device must be exactly equal to an edge or center of the external clock (CLK and CLKB).

As known from asynchronous semiconductor memory devices, however, data are not always outputted in synchronization with the external clock (CLK and CLKB) even though an output command and the external clock (CLK and CLKB) are applied to general semiconductor memory devices.

Why the data are not synchronized with the external clock (CLK and CLKB) in such a semiconductor memory device is as followings.

First, it is assumed that the external clock (CLK and CLKB) buffered through an input buffering circuit in the semiconductor memory device is an internal clock. The internal clock may change its phase while passing through various internal elements, e.g., a control circuit, a peripheral circuit and a cell array, of the semiconductor memory device. Accordingly, the internal clock is not synchronized with the external clock (CLK and CLKB) when the internal clock is outputted to the outside through an output buffering circuit.

Since the output data of the semiconductor memory device are outputted in synchronization with the internal clock, there is also a phase difference between the data and the external clock (CLK and CLKB), which corresponds to a phase difference between the internal clock and the external clock (CLK and CLKB). That is, the data outputted from the semiconductor memory device are asynchronous with the external clock (CLK and CLKB).

Therefore, in order to output the input/output data in synchronization with the external clock (CLK and CLKB) which is used as a reference clock in the semiconductor memory device, the internal clock must be inversely compensated for a delay time that the internal clock applied to an output pad is delayed with respect to the inputted external clock (CLK and CLKB) due to operation of the semiconductor memory device. Through such inverse compensation, the phase of the internal clock can be synchronized with the phase of the external clock (CLK and CLKB).

A phase locked loop (PLL) and a delay locked loop (DLL) are representatively used as a circuit for synchronizing the internal clock with the external clock (CLK and CLKB) by inversely compensating for the delay time that the phase of the internal clock is delayed.

The PLL is used for synchronizing a frequency and a phase at the same time using a frequency multiplication function when there is a frequency difference between the external clock, which is a reference clock mainly inputted from the outside, and the internal clock, which is used in the semiconductor memory device.

The DLL is used for synchronizing only a phase in the case where the external clock is equal in frequency to the internal clock.

Comparing only characteristics themselves of the PLL and the DLL with each other, the PLL seems to be more popularly used than the DLL because the PLL has a supplementary function, i.e., frequency multiplication function. Actually, however, the DLL is more popularly used than the PLL in the semiconductor memory device.

There may be several reasons for this, a representative one of which is that the DLL has such advantageous merits that the DLL is less affected by noise and can be formed in a smaller area than the PLL.

FIG. 1 is a block diagram illustrating a conventional DLL.

Referring to FIG. 1, the conventional DLL includes a delay-locking unit 100, a phase detection unit 120, and a phase mixing unit 140. The delay-locking unit 100 generates a first delay clock RISING_CLK corresponding to a first clock edge, e.g., rising edge of a reference clock REF_CLK, and a second delay clock FALLING_CLK corresponding to a second clock edge, e.g., falling edge of the reference clock REF_CLK so as to achieve a delay-locking. The phase detection unit 120 detects a phase difference between the first delay clock RISING_CLK and the second delay clock FALLING_CLK to output a weight select signal WR_SEL. The phase mixing unit 140 mixes phases of the first and second delay clocks RISING_CLK and FALLING_CLK by applying a weight corresponding to the weight select signal WR_SEL at a point of time when the first and second delay clocks RISING_CLK and FALLING_CLK are delay locked, thereby outputting DLL clocks DLL_CLK_USE and DLL_CLK_DUMMY. The conventional DLL further includes a phase split unit 160 and a dummy phase split unit 170. The phase split unit 160 splits phases of the DLL clock DLL_CLK_USE and DLL_CLK_DUMMY to generate first and second split clocks RCLKDLL and FCLKDLL. The dummy phase split unit 170 has the same configuration as the phase split unit 160 but does not operate actually.

The phase mixing unit 140 includes a delay lock enable signal generator 146, a mixing controller 142, a DCC phase mixer 144 and a dummy DCC phase mixer 145. The delay lock enable signal generator 146 generates a delay lock enable signal DCC_EN of which a logic level is determined in response to a first delay lock signal LOCK_STATE_R and a second delay lock signal LOCK_STATE_F. The first delay lock signal LOCK_STATE_R corresponds to whether the first delay clock RISING_CLK is delay locked or not, and the second delay lock signal LOCK_STATE_F corresponds to whether the second delay clock FALLING_CLK is delay locked or not. The mixing controller 142 generates a mixing control signal CTRL for controlling a mixing ratio of the first and second delay clocks RISING_CLK and FALLING_CLK in response to the weight select signal WR_SEL when the delay lock enable signal DCC_EN is activated. The DCC phase mixer 144 mixes phases of the first and second delay clocks RISING_CLK and FALLING_CLK at the mixing ratio corresponding to the mixing control signal CTRL to thereby output the DLL clock DLL_CLK_USE. The dummy DCC phase mixer 145 has the same configuration as the DCC phase mixer 144 but does not operate actually.

The delay-locking unit 100 includes a first phase delay 102, a second phase delay 104, a first delay replica model 103 and a second delay replica model 105 for achieving a delay-locking. The first phase delay 102 delays a first clock CLK_IN_R corresponding to a first clock edge, e.g., rising edge, of the reference clock REF_CLK by a delay time determined through comparing phases of the reference clock REF_CLK and a first feedback clock FEB_CLK1 with each other, thereby outputting the first delay clock RISING_CLK. The second phase delay 104 delays a second clock CLK_IN_F corresponding to a second clock edge, e.g., falling edge, of the reference clock REF_CLK by a delay time determined through comparing phases of the reference clock REF_CLK and a second feedback clock FEB_CLK2 with each other, thereby outputting the second delay clock FALLING_CLK. The first delay replica model 103 outputs the first feedback clock FEB_CLK1 by applying an actual delay condition of the first clock CLK_IN_R to the first delay clock RISING_CLK. The second delay replica model 105 outputs the second feedback clock FEB_CLK2 by applying an actual delay condition of the second clock CLK_IN_F to the second delay clock FALLING_CLK. The delay-locking unit 100 further includes a clock buffer 106 configured to buffer the external clocks CLK and CLKB inputted from the outside to output the reference clock REF_CLK and the first and second clocks CLK_IN_R and CLK_IN_F.

The first phase delay 102 includes a first phase comparator 1022 and a first delay line 1024. The first phase comparator 1022 compares the phase of the first feedback clock FEB_CLK1 with that of the reference clock REF_CLK to generate a first delay control signal DELAY_CON1. The first delay line 1024 delays the first clock CLK_IN_R by a delay time determined corresponding to the first delay control signal DELAY_CON1 to output the first delay clock RISING_CLK.

The second phase delay 104 includes a second phase comparator 1042 and a second delay line 1044. The second phase comparator 1042 compares the phase of the second feedback clock FEB_CLK2 with that of the reference clock REF_CLK to generate a second delay control signal DELAY_CON2. The second delay line 1044 delays the second clock CLK_IN_F by a delay time determined corresponding to the second delay control signal DELAY_CON2 to output the second delay clock FALLING_CLK.

Operation of the conventional DLL having the above configuration will be described below.

FIG. 2 is a timing diagram illustrating waveforms of clocks or signals during operation of the conventional DLL of FIG. 1.

In the left of FIG. 2, there are shown activation/deactivation states of the source clock REF_CLK, the first delay clock RISING_CLK, the second delay clock FALLING_CLK and the DLL clocks DLL_CLK_USE and DLL_CLK_DUMMY during the operation in a state before a delay is locked. For convenience in description, a state before the delay is locked will be referred to as a before-delay-locked state, and a state after the delay is locked will be referred to as an after-delay-locked state, hereinafter. Herein, the reference clock REF_CLK is generated by buffering the external clock CLK and CLKB through the clock buffer 106 when DLL starts operating initially, the first delay clock RISING_CLK is generated by delaying the first clock CLK_IN_R by an initial delay time through the first delay line 1024, the second delay clock FALLING_CLK is generated by delaying the second clock CLK_IN_F by an initial delay time through the second delay line 1044, and the DLL clocks DLL_CLK_USE and DLL_CLK_DUMMY are generated at an output terminal of the DLL.

Specifically, the reference clock REF_CLK is substantially the same as the external clock CLK and CLKB because the reference clock REF_CLK is a clock obtained by buffering the external clock CLK and CLKB. Although not shown, the first and second clocks CLK_IN_R and CLK_IN_F are also the same as the reference clock REF_CLK.

The first and second delay lines 1024 and 1044 are configured such that they have the same initial delay times (①  and ③) to delay received clocks and respectively output clocks of which phases are opposite to each other if receiving the same input clocks. Therefore, when the first and second clocks CLK_IN_R and CLK_IN_F, which are the same clocks, are respectively inputted to the first and second delay lines 1024 and 1044, the first and second delay clocks RISING_CLK and FALLING_CLK, which have opposite phases to each other, are outputted, as illustrated in FIGS. 1 and 2.

Comparing the first and second delay clocks RISING_CLK and FALLING_CLK with the reference clock REF_CLK, the first delay clock RISING_CLK has a rising edge after the initial delay time (①) from a point of time corresponding to a first edge, e.g., rising edge, of the reference clock REF_CLK, and the second delay clock FALLING_CLK has a falling edge after the initial delay time (③) from a point of time corresponding to a second edge, e.g., falling edge, of the reference clock REF_CLK.

In the before-delay-locked state, the DLL clocks DLL_CLK_USE and DLL_CLK_DUMMY are the same as the first and second delay clocks RISING_CLK and FALLING_CLK because the first and second delay clocks RISING_CLK and FALLING_CLK are not delay locked yet and thus the phase mixing unit 140 does not operate.

When the first and second delay clocks RISING_CLK and FALLING_CLK are not delay locked, the phase mixing unit 140 does not operate so that a clock inputted to the phase mixing unit 140 is bypassed.

Operation of the conventional DLL for changing activation/deactivation states of respective clocks in the before-delay-locked state will be more fully described below.

First, a rising edge of the first delay clock RISING_CLK outputted from the first delay line 1024 is delay locked, i.e., synchronized, with a rising edge of the reference clock REF_CLK by appropriately controlling the first delay line 1024 such that the first clock CLK_IN_R, which has been delayed by the initial delay time (①), is further delayed by a first predetermined delay time (②).

At the same time, a rising edge of the second delay clock FALLING_CLK outputted from the second delay line 1044 is delay locked, i.e., synchronized, with the rising edge of the reference clock REF_CLK by appropriately controlling the second delay line 1044 such that the second clock CLK_IN_F, which has been delayed by the initial delay time (③), is further delayed by a second predetermined delay time (④).

After the first and second delay clocks RISING_CLK and FALLING_CLK are delay locked, a phase difference between the first and second delay clocks RISING_CLK and FALLING_CLK is detected so that the DLL clocks DLL_CLK_USE and DLL_CLK_DUMMY with a duty ratio corrected are generated.

For reference, in the before-delay-locked state, the dummy DCC phase mixer 145 of the phase mixing unit 140 bypasses the input clock like the DCC phase mixer 144. However, when entering the after-delay-locked state, the dummy DCC phase mixer 145 stops the bypassing operation and does not perform any operation. That is, in the after-delay-locked state, the dummy DCC phase mixer 145 does not output the DLL clock DLL_CLK_DUMMY that was outputted in the before-delay-locked state.

Likewise, before the first and second delay clocks RISING_CLK and FALLING_CLK are delay locked, the dummy phase split unit 170 is connected to an output terminal of the dummy DCC phase mixer 145 and thus it serves as a load when bypassing a clock inputted from the dummy DCC phase mixer 145. In the after-delay-locked state, however, the dummy phase split unit 170 does not perform any operation because there is no bypassed clock.

In the right of FIG. 2, there are shown activation/deactivation states of various clocks or signals during operation in the after-delay-locked state, that is, during operation of detecting the phase difference between the first and second delay clocks RISING_CLK and FALLING_CLK to thereby generate the DLL clocks DLL_CLK_USE and DLL_CLK_DUMMY with a duty ratio corrected.

Generally, it is almost impossible for the external clock CLK and CLKB inputted from the outside to have a duty ratio of 50 to 50 exactly. Therefore, it is also impossible for the internal clock obtained by buffering the external clock CLK and CLKB to have a duty ratio of 50 to 50 exactly.

In synchronous semiconductor memory devices such as DDR SDRAMs, DDR2 SDRAMs and DDR3 SDRAMs, where one data is outputted at a rising edge of the internal clock and another data is outputted at a falling edge of the internal clock, if data is outputted corresponding to the internal clock that does not have a duty ratio of 50 to 50 exactly, a memory controller may receive incorrect data.

For this reason, the duty ratio of the outputted internal clock must be exactly corrected to 50 to 50. To this end, as described above, there is employed a phase-mixing method including: detecting the phase difference between the first and second delay clocks RISING_CLK and FALLING_CLK; and mixing phases of the first and second delay clocks RISING_CLK and FALLING_CLK by applying a weight to one of the first and second delay clocks RISING_CLK and FALLING_CLK according to the detection result.

In detail, in order to detect the phase difference between the first and second delay clocks RISING_CLK and FALLING_CLK, a falling edge point (⑦) of the first delay clock RISING_CLK is compared with a falling edge point (⑧) of the second delay clock FALLING_CLK assuming that rising edge points of the first and second delay clocks RISING_CLK and FALLING_CLK are equal to each other because the first and second delay clocks RISING_CLK and FALLING_CLK are delay locked. Thereafter, it is detected which one has a longer activation section between the first and second delay clocks RISING_CLK and FALLING_CLK.

To apply a weight to the delay clock, one of the first and second delay clocks RISING_CLK and FALLING_CLK, to which a weight will be applied, is selected first using a weight selection signal WR_SEL. Here, a degree of weight can also be selected by appropriately adjusting information that the weight selection signal WR_SEL signifies.

Referring to the right of FIG. 2, it can be appreciated that a method of correcting the duty ratio is divided into two modes in the after-delay-locked state.

In a first mode, an activation section of the first delay clock RISING_CLK is relatively narrow but an activation section of the second delay clock FALLING_CLK is relatively broad in a state that the rising edges of the first and second delay clocks RISING_CLK and FALLING_CLK are delay locked with the rising edge of the reference clock REF_CLK.

Contrariwise, in a second mode, an activation section of the first delay clock RISING_CLK is relatively broad but an activation section of the second delay clock FALLING_CLK is relatively narrow in a state that the rising edge of the reference clock REF_CLK is delay locked with the rising edges of the first and second delay clocks RISING_CLK and FALLING_CLK.

A method of correcting the duty ratio using the weight selection signal WR_SEL will be illustrated depending on the first and second modes.

In the first mode, since the activation section of the first delay clock RISING_CLK is relatively narrow but the activation section of the second delay clock FALLING_CLK is relatively broad, the weight selection signal WR_SEL goes to a logic high level and thus the weight is applied to the first delay clock RISING_CLK. As a result, the duty ratio of the DLL clock DLL_CLK_USE outputted finally can be 50 to 50 exactly.

Similarly, in the second mode, since the activation section of the first delay clock RISING_CLK is relatively broad but the activation section of the second delay clock FALLING_CLK is relatively narrow, the weight selection signal WR_SEL goes to a logic low level and thus the weight is applied to the second delay clock FALLING_CLK. As a result, the duty ratio of the DLL clock DLL_CLK_USE outputted finally can be 50 to 50 exactly.

FIG. 3 is a timing diagram illustrating waveforms of input/output clocks or signals before and after a failure occurs under the worst operating condition in the conventional DLL of FIG. 1.

Referring to FIG. 3, it can be appreciated that a problem may occur in the conventional DLL if the weight selection signal WR_SEL is undesirably changed under the worst operating condition of the semiconductor memory device, for example, noise interference, PVT variation or frequent entry/exit of a power down mode.

Specifically, it can be observed that waveforms of input/output clocks shown in the left of FIG. 3 before a failure occurs is identical to those in the second mode of the after-delay-locked state as illustrated in FIG. 2. That is, before the failure occurs, the activation section of the first delay clock RISING_CLK is relatively broad but the activation section of the second delay clock FALLING_CLK is relatively narrow in a state that the rising edges of the first and second delay clocks RISING_CLK and FALLING_CLK are delay locked with the rising edge of the reference clock REF_CLK.

In this state before the failure occurs, the duty ratio between the DLL clocks DLL_CLK_USE and DLL_CLK_DUMMY is set to 50 to 50 by applying a weight to the second delay clock FALLING_CLK using the weight selection signal WR_SEL.

Meanwhile, if noise interference, PVT variation or frequent entry/exit of a power down mode takes place in the semiconductor memory device, the rising edges of the first and second delay clocks RISING_CLK and FALLING_CLK, which has been delay locked, may not coincide with each other.

Of course, the delay-locking unit 100 detects the non-coincidence state, and then again operates delay locking the rising edges of the first and second delay clocks RISING_CLK and FALLING_CLK of which phases do not coincide with each other.

However, under the worst operating condition where the noise interference, the PVT variation or the frequent entry/exit of a power down mode becomes severer and severer, a rising edge point of the first delay clock RISING_CLK may lag behind a falling edge point of the second delay clock FALLING_CLK in operation after the failure occurs, which will be depicted in the right of FIG. 3.

If a rising edge point (①) of the first delay clock RISING_CLK lags behind a falling edge point (②) of the second delay clock FALLING_CLK, the phase detection unit 120 malfunctions because the phase detection unit 120 compares a falling edge point (④) of the first delay clock RISING_CLK with the falling edge point (②) of the second delay clock FALLING_CLK assuming that the rising edge points (① and ③) of the first and second delay clocks RISING_CLK and FALLING_CLK are equal to each other. Accordingly, the phase detection unit 120 incorrectly compares a falling edge point (⑤) of the first delay clock RISING_CLK, which is earlier by one period than the falling edge point (④) of the first delay clock RISING_CLK, with the falling edge point (②) of the second delay clock FALLING_CLK.

That is, although the phase mixing unit 140 should determine that the activation section of the first delay clock RISING_CLK is greater than the activation section of the second delay clock FALLING_CLK and thus apply a weight to the second delay clock FALLING_CLK using the weight selection signal WR_SEL, the phase mixing unit 140 malfunctions during the worst operating condition such as noise interference, PVT variation and frequent entry/exit of a power down mode. This leads to a problem in that the phase mixer 140 incorrectly determines that the activation section of the second delay clock FALLING_CLK seems to be greater than the activation section of the first delay clock RISING_CLK and thus apples a weight to the first delay clock RISING_CLK using the weight selection signal WR_SEL.

Consequently, the duty ratio between the DLL clocks DLL_CLK_USE and DLL_CLK_DUMMY is changed. Even if data are outputted corresponding to the DLL clocks DLL_CLK_USE and DLL_CLK_DUMMY with the duty ratio changed, the memory controller cannot receive correct data so that it is impossible to normally input/output data, causing malfunction in a system.

This problem is more likely to occur if the external clock CLK and CLKB has a shorter period. As the period of the external clock CLK and CLKB becomes shorter, an operating speed of the semiconductor memory device becomes faster. Since it is expected that the operating speed of the semiconductor memory device will be much faster than now, there is a great likelihood that the above-described problem occurs in semiconductor memory devices that will be developed in the future.

SUMMARY OF THE INVENTION

Embodiments of the invention are directed to providing a delay locked loop (DLL), which can stably operate even under the worst operating condition of a semiconductor memory device such as noise interference, process/voltage/temperature (PVT) variation and frequent entry/exit of a power down mode.

In accordance with an aspect of the invention, there is provided a delay locked loop (DLL) including a delay-locking unit configured to generate first and second delay clocks corresponding to first and second clock edges of a reference clock for achieving a delay-locking; a phase detection unit configured to detect a phase difference between the first and second delay clocks to output a weight selection signal; a weight storage unit configured to store the weight selection signal obtained during a predetermined period from a point of time when the first and second delay clocks are delay locked; and a phase mixing unit configured to mix phases of the first and second delay clocks to output a DLL clock by applying a weight corresponding to the stored weight selection signal in the weight storage unit.

In accordance with another aspect of the invention, there is provided a delay locked loop (DLL) including a first phase delay unit configured to delay a first clock corresponding to a first clock edge of a reference clock by a delay time determined through comparing phases of the reference clock and a first feedback clock with each other to output the first delay clock for achieving a delay-locking; a first delay replica model configured to output the first feedback clock by applying an actual delay condition of the first clock to the first delay clock; a second phase delay unit configured to delay a second clock corresponding to a second clock edge of the reference clock by a delay time determined through comparing phases of the reference clock and a second feedback clock with each other to output the second delay clock for achieving a delay-locking; a second delay replica model configured to output the second feedback clock by applying an actual delay condition of the second clock to the second delay clock; a phase detection unit configured to detect a phase difference between the first and second delay clocks to output a weight selection signal; a weight storage unit configured to store the weight selection signal obtained during a predetermined period from a point of time when the first and second delay clocks are delay locked; and a phase mixing unit configured to mix phases of the first and second delay clocks to output a DLL clock by applying a weight corresponding to the stored weight selection signal in the weight storage unit.

BRIEF DESCRIPTION OF THE DRAWINGS

FIG. 8 is a timing diagram illustrating waveforms of input/output clocks or signals before and after a failure occurs under the worst operating condition in the DLL of FIG. 4.

DESCRIPTION OF SPECIFIC EMBODIMENTS

Hereinafter, a delay locked loop (DLL) and an operating method thereof in accordance with the invention will be described in detail with reference to the accompanying drawings.

Figure 4:
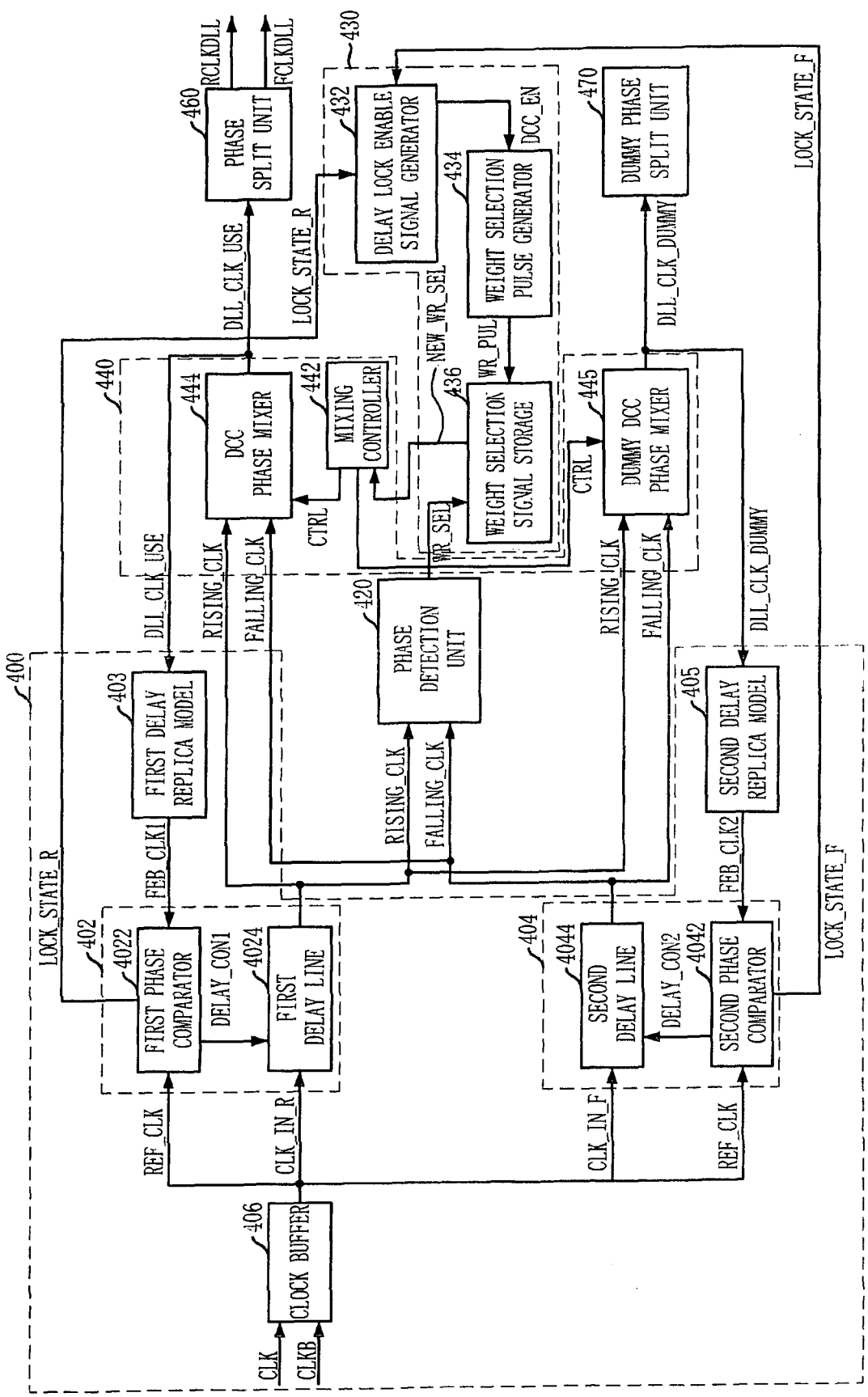
FIG. 4 is a block diagram of a DLL in accordance with an embodiment of the invention.

FIG. 4 is a block diagram of a DLL in accordance with an embodiment of the invention.

Referring to FIG. 4, the DLL in accordance with the embodiment of the invention includes a delay-locking unit 400, a phase detection unit 420, a weight storage unit 430 and a phase mixing unit 440. The delay-locking unit 400 generates a first delay clock RISING_CLK corresponding to a first clock edge, e.g., rising edge, of a reference clock REF_CLK, and a second delay clock FALLING_CLK corresponding to a second clock edge, e.g., falling edge, of the reference clock REF_CLK for achieving a delay-locking. The phase detection unit 420 detects a phase difference between the first and second delay clocks RISING_CLK and FALLING_CLK to output a weight selection signal WR_SEL. The weight storage unit 430 stores the weight selection signal obtained during a predetermined period from a point of time when the first and second delay clocks RISING_CLK and FALLING_CLK are delay locked. The phase mixing unit 440 mixes phases of the first and second delay clocks RISING_CLK and FALLING_CLK by applying a weight corresponding to a stored weight selection signal NEW_WR_SEL in the weight storage unit 430. The DLL in accordance with the embodiment of the invention further includes a phase split unit 460 and a dummy phase split unit 470. The phase split unit 460 splits phases of DLL clocks DLL_CLK_USE and DLL_CLK_DUMMY to generate first and second phase split clocks RCLKDLL and FCLKDLL. The dummy phase split unit 470 has the same configuration as the phase split unit 460 but does not operate actually.

The phase mixing unit 440 includes a mixing controller 442, a DCC phase mixer 444 and a dummy DCC phase mixer 445. The mixing controller 442 generates a mixing control signal CTRL so as to control a mixing ratio between the first and second delay clocks RISING_CLK and FALLING_CLK in response to the stored weight selection signal NEW_WR_SEL. The DCC phase mixer 444 mixes the phases of the first and second delay clocks RISING_CLK and FALLING_CLK at a mixing ratio corresponding to the mixing control signal CTRL to thereby output the DLL clock DLL_CLK_USE. The dummy DCC phase mixer 445 has the same configuration as the DCC phase mixer 444 but does not operate actually.

The weight storage unit 430 includes a delay lock enable signal generator 432, a weight selection pulse generator 434 and a weight selection signal storage 436. The delay lock enable signal generator 432 generates a delay lock enable signal DCC_EN of which a logic level is determined in response to a first delay lock signal LOCK_STATE_R and a second delay lock signal LOCK_STATE_F. Herein, the first delay lock signal LOCK_STATE_R corresponds to whether the first delay clock RISING_CLK is delay locked or not, and the second delay lock signal LOCK_STATE_F corresponds to whether the second delay clock FALLING_CLK is delay locked or not. The weight selection pulse generator 434 generates a weight selection pulse WR_PUL having a predetermined activation section in response to the delay lock enable signal DCC_EN. The weight selection signal storage 436 stores the weight selection signal WR_SEL inputted during the activation section of the weight selection pulse WR_PUL but does not store the weight selection signal WR_SEL inputted during the deactivation section of the weight selection pulse WR_PUL.

The delay-locking unit 400 includes a first phase delay 402, a second phase delay 404, a first delay replica model 403 and a second delay replica model 405 so as to achieve a delay-locking. The first phase delay 402 delays a first clock CLK_IN_R corresponding to a first clock edge, e.g., rising edge, of the reference clock REF_CLK by a delay time determined through comparing phases of the reference clock REF_CLK and a first feedback clock FEB_CLK1 with each other, thereby outputting the first delay clock RISING_CLK. The second phase delay 404 delays a second clock CLK_IN_F corresponding to a second clock edge, e.g., falling edge, of the reference clock REF_CLK by a delay time determined through comparing phases of the reference clock REF_CLK and a second feedback clock FEB_CLK2 with each other, thereby outputting the second delay clock FALLING_CLK. The first delay replica model 403 outputs the first feedback clock FEB_CLK1 by applying an actual delay condition of the first clock CLK_IN_R to the first delay clock RISING_CLK. The second delay replica model 405 outputs the second feedback clock FEB_CLK2 by applying an actual delay condition of the second clock CLK_IN_F to the second delay clock FALLING_CLK. The delay-locking unit 400 further includes a clock buffer 406 configured to buffer the external clocks CLK and CLKB inputted from the outside to output the reference clock REF_CLK and the first and second clocks CLK_IN_R and CLK_IN_F.

Here, the first phase delay 402 includes a first phase comparator 4022 and a first delay line 4024. The first phase comparator 4022 compares the phase of the first feedback clock FEB_CLK1 with that of the reference clock REF_CLK to generate a first delay control signal DELAY_CON1. The first delay line 4024 delays the first clock CLK_IN_R by a delay time determined corresponding to the first delay control signal DELAY_CON1 to output the first delay clock RISING_CLK.

The second phase delay 404 includes a second phase comparator 4042 and a second delay line 4044. The second phase comparator 4042 compares the phase of the second feedback clock FEB_CLK2 with that of the reference clock REF_CLK to generate a second delay control signal DELAY_CON2. The second delay line 4044 delays the second clock CLK_IN_F by a delay time determined corresponding to the second delay control signal DELAY_CON2 to output the second delay clock FALLING_CLK.

Figure 5:
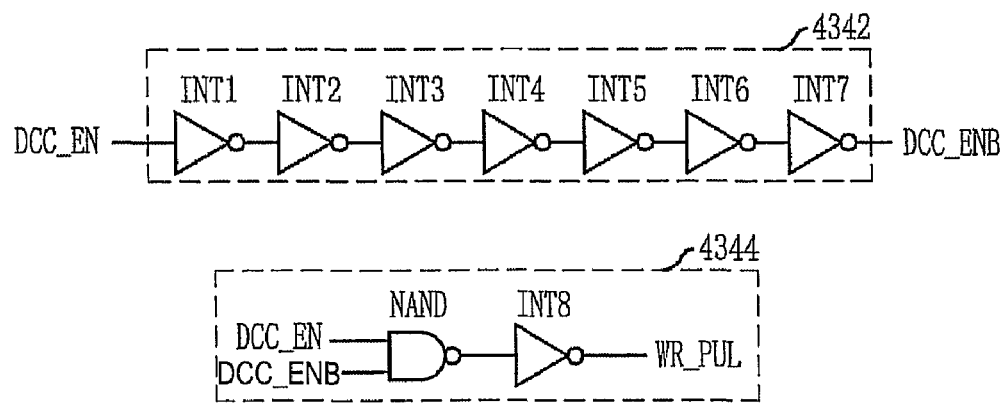
FIG. 5 is a circuit diagram illustrating a weight selection pulse generator in the DLL of FIG. 4

FIG. 5 is a circuit diagram illustrating the weight selection pulse generator 434 in the DLL of FIG. 4

Referring to FIG. 5, the weight selection pulse generator 434 includes a delay inverter 4342 and a weight selection pulse output unit 4344. The delay inverter 4342 delays the delay lock enable signal DCC_EN by a predetermined time, and inverts a phase of the delay lock enable signal DCC_EN. The weight selection pulse output unit 4344 receives the delay lock enable signal DCC_EN and an output signal DCC_ENB of the delay inverter 4342 to output the weight selection pulse WR_PUL having a predetermined activation section.

The delay inverter 4342 includes an inverter chain provided with a plurality of inverters INT1, INT2, INT3, INT4, INT5, INT6 and INT7.

The weight selection pulse output unit 4344 includes a NAND gate configured to perform a NAND operation on the delay lock enable signal DCC_EN and the output signal DCC_ENB of the delay inverter 4342, and an inverter INT8 configured to receive an output signal of the NAND gate NAND to output the weight selection pulse WR_PUL.

Figure 6:
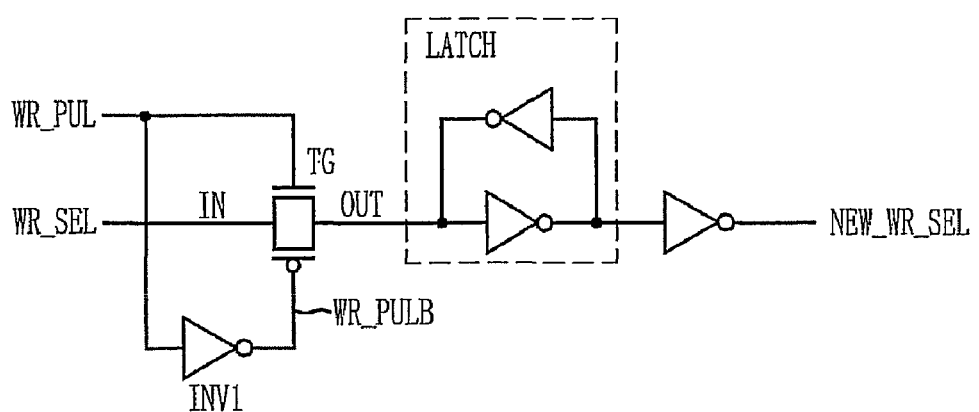
FIG. 6 is a circuit diagram illustrating a weight selection signal storage in the DLL of FIG. 4.

FIG. 6 is a circuit diagram illustrating the weight selection signal storage 436 in the DLL of FIG. 4.

Referring to FIG. 6, the weight selection signal storage 436 includes a transfer gate TG and a latch LATCH. The transfer gate TG controls the weight selection signal WR_SEL received through an input terminal IN to be applied to an output terminal OUT in response to the weight selection pulse WR_PUL applied to a positive control terminal and a weight selection bar pulse WR_PULB applied to a negative control terminal. Here, the weight selection bar pulse WR_PULB is an inversion pulse of the weight selection pulse WR_PUL.

The latch LATCH latches an output signal of the transfer gate TG to output the stored weight selection signal NEW_WR_SEL.

Figure 7:
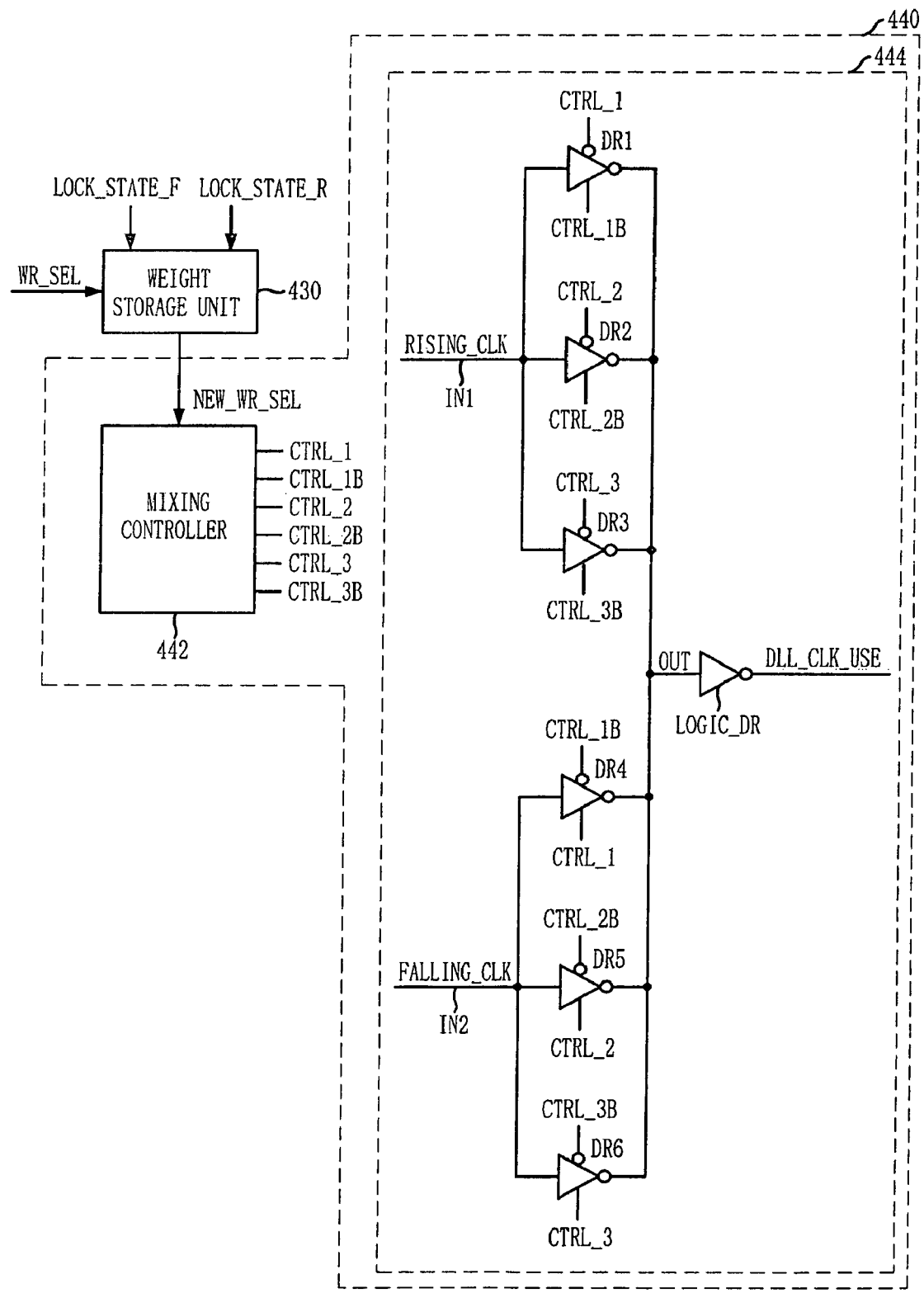
FIG. 7 is a circuit diagram illustrating a DCC phase mixer in the DLL of FIG. 4.

FIG. 7 is a circuit diagram illustrating the DCC phase mixer 444 in the DLL of FIG. 4.

Referring to FIG. 7, the DCC phase mixer 444 includes first through sixth drivers DR1, DR2, DR3, DR4, DR5 and DR6, and a logic determination driver LOGIC_DR. The first through third drivers DR1, DR2 and DR3 supply the first delay clock RISING_CLK applied to a first input terminal IN1 to an output terminal OUT with a driving force varied corresponding to first through third mixing control signals CTRL_1, CTRL_1B, CTRL_2, CTRL_2B, CTRL_3 and CTRL_3B outputted from the mixing controller 442. Likewise, the fourth through sixth drivers DR4, DR5 and DR6 supply the second delay clock FALLING_CLK applied to a second input terminal IN2 to the output terminal OUT with a driving force varied corresponding to fourth through sixth mixing control signals CTRL_4, CTRL_4B, CTRL_5, CTRL_5B, CTRL_6 and CTRL_6B outputted from the mixing controller 442. The logic determination driver LOGIC_DR receives a voltage applied to the output terminals of the first through sixth drivers DR1, DR2, DR3, DR4, DR5 and DR6 to output the DLL clock DLL_CLK_USE using a predetermined logic determination level as a reference.

Here, the predetermined logic determination level means a reference level used to distinguish a logic level between 'High' and 'Low'. For example, when a level of the voltage applied to the output terminal OUT is higher than the logic determination level, the logic determination driver LOGIC_DR outputs the DLL clock DLL_CLK_USE of logic high level. On the contrary, when a level of the voltage applied to the output terminal OUT is lower than the logic determination level, the logic determination driver LOGIC_DR outputs the DLL clock DLL_CLK_USE of logic low level.

Operation of the DLL in accordance with the embodiment of the invention will be described below.

Figure 1:
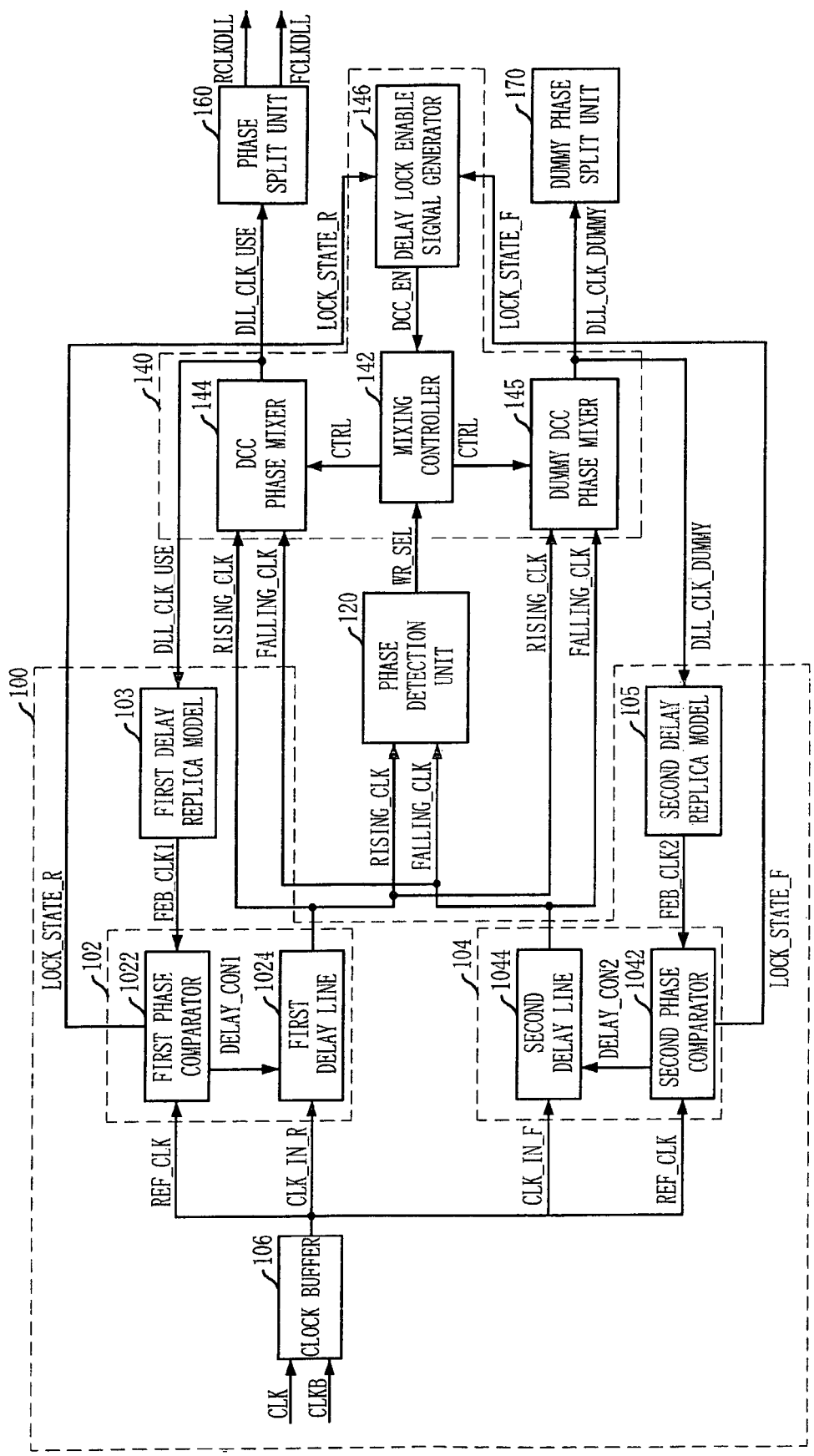
FIG. 1 is a block diagram illustrating a conventional delay locked loop (DLL).

The operation of generating the first and second delay clocks RISING_CLK and FALLING_CLK corresponding to the first and second clock edges, e.g., rising and falling edges, of the reference clock REF_CLK has been fully explained in the conventional CLL of FIG. 1, and thus further description for it will be omitted herein.

FIG. 8 is a timing diagram illustrating waveforms of input/output clocks or signals before and after a failure occurs under the worst operating condition in the DLL of FIG. 4.

Referring to FIG. 8, it can be appreciated that a problem may occur in the DLL of the invention if the weight selection signal WR_SEL is undesirably changed under the worst operating condition of the semiconductor memory device, for example, noise interference, process/voltage/temperature (PVT) variation or frequent entry/exit of a power down mode, as described already in the conventional DLL.

In the DLL in accordance with the embodiment of the invention, however, it is possible to prevent the duty ratio of the DLL clock DLL_CLK_USE from being varied because a logic level of the stored weight selection signal is not changed even if the weight selection signal WR_SEL is undesirably changed.

Figure 2:
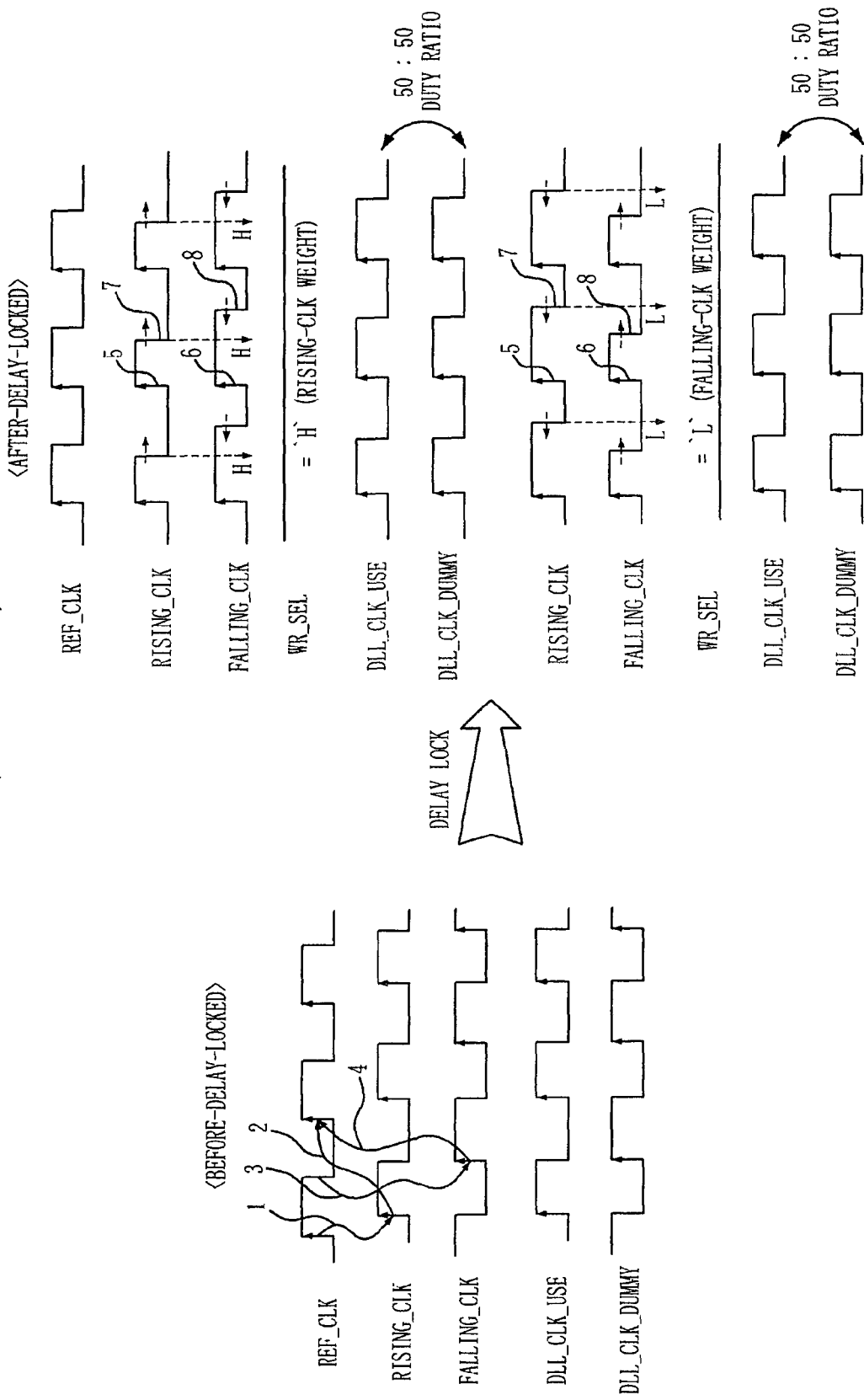
FIG. 2 is a timing diagram illustrating waveforms of clocks or signals during operation of the conventional DLL of FIG. 1.
Figure 3:
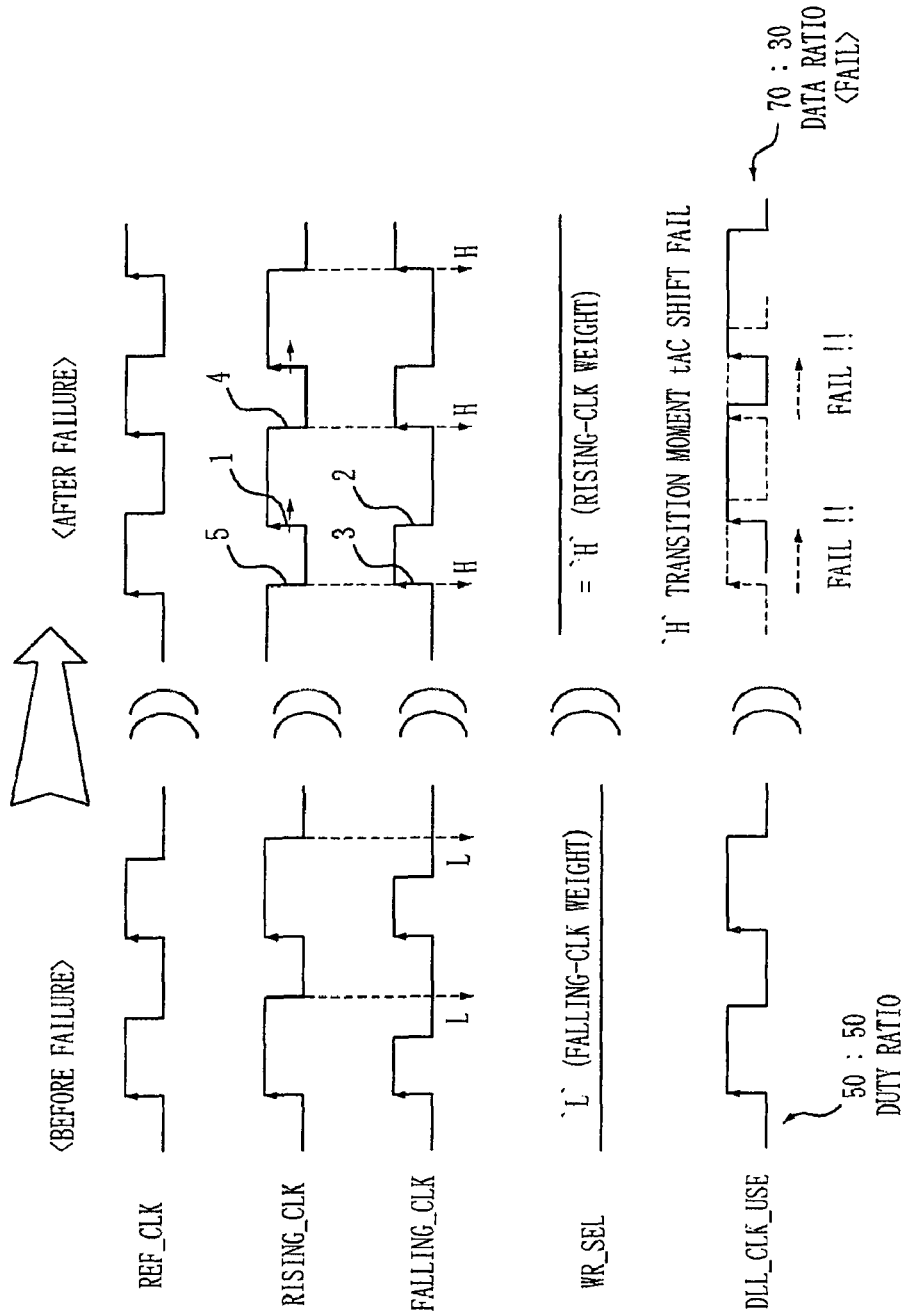
FIG. 3 is a timing diagram illustrating waveforms of input/output clocks or signals before and after a failure occurs under the worst operating condition in the conventional DLL of FIG. 1.

Specifically, waveforms of input/output clocks shown in the left of FIG. 8 before a failure occurs is identical to those in the second mode of the after-delay-locked state as illustrated in the conventional DLL with reference to FIG. 2. That is, before the failure occurs, the activation section of the first delay clock RISING_CLK is relatively broad but the activation section of the second delay clock FALLING_CLK is relatively narrow in a state that the rising edges of the first and second delay clocks RISING_CLK and FALLING_CLK are delay locked with the rising edge of the reference clock REF_CLK.

The weight selection pulse WR_PUL is activated only during a predetermined period (⑥) from a point of time when the delay lock enable signal DCC_EN is activated, and thus can be stored as the weight selection signal NEW_WR_SEL.

That is, the weight selection signal WR_SEL of logic low level for applying a weight to the second delay clock FALLING_CLK is stored as the stored weight selection signal NEW_WR_SEL and then applied to the DLL clock DLL_CLK_USE. As a result, the duty ratio between the DLL clocks DLL_CLK_USE and DLL_CLK_DUMMY can be adjusted to 50 to 50 exactly.

In such a state, if noise interference, PVT variation or frequent entry/exit of a power down mode takes place in the semiconductor memory device, the rising edges of the first and second delay clocks RISING_CLK and FALLING_CLK, which has been delay locked, may not coincide with each other.

Of course, the delay-locking unit 400 detects such a non-coincidence state, and then again operates delay locking the rising edges of the first and second delay clocks RISING_CLK and FALLING_CLK of which phases do not coincide with each other.

However, under the worst operating condition where the noise interference, the PVT variation or the frequent entry/exit of a power down mode becomes severer and severer, a rising edge point of the first delay clock RISING_CLK may lag behind a falling edge point of the second delay clock FALLING_CLK in operation after the failure occurs, which will be depicted in the right of FIG. 8.

If a rising edge point (①) of the first delay clock RISING_CLK lags behind a falling edge point (②) of the second delay clock FALLING_CLK, the phase detection unit 120 malfunctions because the phase detection unit 120 compares a falling edge point (④) of the first delay clock RISING_CLK with the falling edge point (②) of the second delay clock FALLING_CLK assuming that the rising edge points (① and ③) of the first and second delay clocks RISING_CLK and FALLING_CLK are equal to each other. Accordingly, the phase detection unit 120 incorrectly compares a falling edge point (⑤) of the first delay clock RISING_CLK, which is earlier by one period than the falling edge point (④) of the first delay clock RISING_CLK, with the falling edge point (②) of the second delay clock FALLING_CLK.

When the logic level of the weight selection signal WR_SEL, which was set such that a weight was applied to the second delay clock FALLING_CLK because it has been determined that the activation section of the first delay clock RISING_CLK was broader than the activation section of the second delay clock FALLING_CLK, changes it logic level from 'Low' to 'High', the phase mixer 140 incorrectly determines that the activation section of the first delay clock RISING_CLK seems to be narrower than the activation section of the second delay clock FALLING_CLK. Accordingly, the weight selection signal WR_SEL is set such that a weight is applied to the first delay clock RISING_CLK.

However, because the weight selection pulse WR_PUL has been already deactivated at the moment that the weight selection signal WR_SEL is transited to a logic high level, the weight selection signal WR_SEL cannot be stored as the stored weight selection signal NEW_WR_SEL. Therefore, the stored weight selection signal NEW_WR_SEL maintains its logic low level even though the weight selection signal WR_SEL goes to logic high level, thus making it possible to maintain the duty ratio between the DLL clocks DLL_CLK_USE and DLL_CLK_DUMMY at 50 to 50 exactly which has been adjusted.

In this way, the application of the embodiment of the invention can prevent the duty ratio of the DLL clock DLL_CLK_USE from being changed due to the worst operating condition by controlling the stored weight selection signal NEW_WR_SEL, which selects a mixture weight of the first and second delay clocks RISING_CLK and FALLING_CLK, not to be varied, even under the worst operating condition such as noise interference, PVT variation and frequent entry/exit of a power down mode. This makes it possible to prevent malfunction of a system because input/output data can maintain the exact duty ratio.

As described above, in accordance with the invention, a DLL clock is generated corresponding to a weight selection signal determined during a predetermined period from a point of time when delay locking operation starts, and thereafter the DLL clock is not affected even though the weight selection signal is varied during operation of the DLL. Therefore, the DLL can stably operate even under the worst operating condition such as noise interference, PVT variation and frequent entry/exit of a power down mode.

This makes it possible to prevent an error in inputting/outputting data because a duty ratio of the data outputted from a semiconductor memory device can be always maintained at a desired ratio. That is, it is possible to prevent erroneous operation in system.

While the invention has been described with respect to the specific embodiments, it will be apparent to those skilled in the art that various changes and modifications may be made without departing from the spirit and scope of the invention as defined in the following claims.

For example, although, in the exemplary embodiments, the first edge is a rising edge and the second edge is a falling edge, the invention is not limited thereto. That is, in the invention, the second edge may be a rising edge and the first edge may be a falling edge.

In the foregoing embodiments, it is exemplarily illustrated that number of drivers and number of mixing control signals are limited to specific numbers in a circuit for mixing phases, but the invention is not limited thereto. Therefore, the number of drivers and the number of mixing control signals may be more than or less than the exemplified specific number.

Logic gates and transistors exemplarily illustrated in the aforesaid embodiments may change their locations and kinds depending on polarities of signals.

What is claimed is:

1. A delay locked loop (DLL), comprising:
a delay-locking unit configured to generate first and second delay clocks corresponding to first and second clock edges of a reference clock so as to achieve a delay locking;
a phase detection unit configured to detect a phase difference between the first and second delay clocks to output a weight selection signal;
a weight storage unit configured to store the weight selection signal obtained only during a predetermined period from a point of time when the first and second delay clocks are delay locked; and
a phase mixing unit configured to mix phases of the first and second delay clocks to output a DLL clock by applying a weight corresponding to the stored weight selection signal in the weight storage unit,
wherein the weight storage unit includes:
a delay lock enable signal generator configured to output a delay lock enable signal in response to a first delay lock signal and a second delay lock signal;
a weight selection pulse generator configured to generate a weight selection pulse in response to the delay lock enable signal; and
a weight selection signal storage configured to store the weight selection signal in response to the weight selection pulse.

2. The DLL as recited in claim 1, wherein the phase mixing unit comprises:
a mixing controller configured to generate a mixing control signal for controlling a mixing ratio between the first and second delay clocks in response to the stored weight selection signal;
a DCC phase mixer configured to mix the phases of the first and second delay clocks at a mixing ratio corresponding to the mixing control signal to generate the DLL clock; and
a dummy DCC phase mixer having the same configuration as the DCC phase mixer, and not operating actually when the first and second delay clocks are entering an after-delay-locked state.

3. The DLL as recited in claim 1, further comprising:
a phase split unit configured to split a phase of the DLL clock to generate a first phase split clock and a second phase split clock; and
a dummy phase split unit having the same configuration as the phase split unit, and not operating actually when the first and second delay clocks are entering an after-delay-locked state.

4. The DLL as recited in claim 1, wherein the delay lock enable signal generator determines a logic level of the delay lock enable signal in response to the first and second delay lock signals, wherein the first delay lock signal corresponds to whether the first delay clock is delay locked, and the second delay lock signal corresponds to whether the second delay clock is delay locked; the weight selection pulse generator generates the weight selection pulse having a predetermined activation section, in response to the delay lock enable signal; and the weight selection signal storage stores the weight selection signal inputted during the activation section of the weight selection pulse, and maintains a logic level of the weight selection signal stored during the activation section of the weight selection pulse when the weight selection pulse is deactivated.

5. The DLL as recited in claim 4, wherein the weight selection pulse generator comprises:
a delay inverter configured to delay the delay lock enable signal by a predetermined delay time, and invert a phase of the delay lock enable signal; and
a weight selection pulse output unit configured to receive the delay lock enable signal and an output signal of the delay inverter to output the weight selection pulse.

6. The DLL as recited in claim 4, wherein the weight selection signal storage comprises: a transfer gate configured to control the weight selection signal received through an input terminal to be applied to an output terminal in response to the weight selection pulse applied to a positive control terminal and a weight selection bar pulse applied to a negative control terminal, and a latch configured to latch an output signal of the transfer gate to output the stored weight selection signal.

7. The DLL as recited in claim 2, wherein the DCC phase mixer comprises:

first through third drivers configured to supply the first delay clock applied to a first input terminal to an output terminal with a driving force varied corresponding to first through third mixing control signals, respectively;
fourth through sixth drivers configured to supply the second delay clock applied to a second input terminal to an output terminal with a driving force varied corresponding to fourth through sixth mixing control signals, respectively; and
a logic determination driver configured to receive a voltage applied to the output terminals of the first through sixth drivers to output the DLL clock using a predetermined logic determination level as a reference.

8. A delay locked loop (DLL) comprising:
a first phase delay unit configured to delay a first clock corresponding to a first clock edge of a reference clock by a delay time determined from a comparison with each other of phases of the reference clock and a first feedback clock, to output the first delay clock for achieving a delay locking;
a first delay replica model configured to output the first feedback clock by applying an actual delay condition of the first clock to the first delay clock;
a second phase delay unit configured to delay a second clock corresponding to a second clock edge of the reference clock by a delay time determined from a comparison with each other of phases of the reference clock and a second feedback clock to output the second delay clock for achieving a delay locking;
a second delay replica model configured to output the second feedback clock by applying an actual delay condition of the second clock to the second delay clock;
a phase detection unit configured to detect a phase difference between the first and second delay clocks to output a weight selection signal;
a weight storage unit configured to store the weight selection signal obtained only during a predetermined period from a point of time when the first and second delay clocks are delay locked; and
a phase mixing unit configured to mix phases of the first and second delay clocks to output a DLL clock by applying a weight corresponding to the stored weight selection signal in the weight storage unit,
wherein the weight storage unit includes:
a delay lock enable signal generator configured to output a delay lock enable signal in response to a first delay lock signal and a second delay lock signal;
a weight selection pulse generator configured to generate a weight selection pulse in response to the delay lock enable signal; and
a weight selection signal storage configured to store the weight selection signal in response to the weight selection pulse.

9. The DLL as recited in claim 8, wherein the phase mixing unit comprises:
a mixing controller configured to generate a mixing control signal for controlling a mixing ratio between the first and second delay clocks in response to the stored weight selection signal;
a DCC phase mixer configured to mix the phases of the first and second delay clocks at a mixing ratio corresponding to the mixing control signal to generate the DLL clock; and
a dummy DCC phase mixer having the same configuration as the DCC phase mixer, and not operating actually when the first and second delay clocks are entering an after-delay-locked state.

10. The DLL as recited in claim 8, further comprising
a phase split unit configured to split a phase of the DLL clock to generate a first phase split clock and a second phase split clock,
a dummy phase split unit having the same configuration as the phase split unit, and not operating actually when the first and second delay clocks are entering an after-delay-locked state.

11. The DLL as recited in claim 8, wherein the delay lock enable signal generator determines a logic level of the delay lock enable signal in response to the first and second delay lock signals, wherein the first delay lock signal corresponds to whether the first delay clock is delay locked, and the second delay lock signal corresponds to whether the second delay clock is delay locked; the weight selection pulse generator generates the weight selection pulse having a predetermined activation section in response to the delay lock enable signal; and the weight selection signal storage stores the weight selection signal inputted during the activation section of the weight selection pulse, and maintains a logic level of the weight selection signal stored during said activation section when the weight selection pulse is deactivated.

12. The DLL as recited in claim 11, wherein the weight selection pulse generator comprises a delay inverter configured to delay the delay lock enable signal by a predetermined delay time, and invert a phase of the delay lock enable signal, and a weight selection pulse output unit configured to receive the delay lock enable signal and an output signal of the delay inverter to output the weight selection pulse having a predetermined activation section.

13. The DLL as recited in claim 11, wherein the weight selection signal storage comprises a transfer gate configured to control the weight selection signal received through an input terminal to be applied to an output terminal in response to the weight selection pulse applied to a positive control terminal and a weight selection bar pulse applied to a negative control terminal, and a latch configured to latch an output signal of the transfer gate to output the stored weight selection signal.

14. The DLL as recited in claim 8, wherein the DCC phase mixer comprises:
first through third drivers configured to supply the first delay clock applied to a first input terminal to an output terminal with a driving force varied corresponding to first through third mixing control signals, respectively;
fourth through sixth drivers configured to supply the second delay clock applied to a second input terminal to an output terminal with a driving force varied corresponding to fourth through sixth mixing control signals, respectively; and
a logic determination driver configured to receive a voltage applied to the output terminals of the first through sixth drivers to output the DLL clock using a predetermined logic determination level as a reference.

15. A method of operating a delay locked loop (DLL), the method comprising:
generating first and second delay clocks corresponding to first and second clock edges of a reference clock for achieving a delay locking;
detecting a phase difference between the first and second delay clocks to output a weight selection signal;
storing the weight selection signal obtained only during a predetermined period from a point of time when the first and second delay clocks are delay locked; and
mixing phases of the first and second delay clocks to output a DLL clock by applying a weight corresponding to the stored weight selection signal in the weight storage unit, wherein said storing the weight signal includes:
  determining a logic level of a delay lock enable signal in response to a first delay lock signal and a second delay lock signal, wherein the first delay lock signal corresponds to whether the first delay clock is delay locked, and the second delay lock signal corresponds to whether the second delay clock is delay locked;
  generating a weight selection pulse having a predetermined activation section in response to the delay lock enable signal;
  storing the weight selection signal inputted during an activation section of the weight selection pulse; and
  maintaining a logic level of the weight selection signal stored during the activation section of the weight selection pulse when the weight selection pulse is deactivated.

16. The method as recited in claim 15, wherein the mixing of the phases of the first and second delay clocks comprises
  generating a mixing control signal for controlling a mixing ratio between the first and second delay clocks in response to the stored weight selection signal, and
  mixing the phase of the first and second delay clocks at a mixing ratio corresponding to the mixing control signal to generate the DLL clock.

17. The method as recited in claim 15, further comprising splitting a phase of the DLL clock to generate a first phase split clock and a second phase split clock.

* * * * *